United States Patent
Summerfelt

(10) Patent No.: US 8,247,855 B2
(45) Date of Patent: Aug. 21, 2012

(54) ENHANCED LOCAL INTERCONNECTS EMPLOYING FERROELECTRIC ELECTRODES

(75) Inventor: Scott R. Summerfelt, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 306 days.

(21) Appl. No.: 11/519,313

(22) Filed: Sep. 12, 2006

(65) Prior Publication Data

US 2008/0121953 A1 May 29, 2008

(51) Int. Cl.
*H01L 21/02* (2006.01)

(52) U.S. Cl. ............. 257/295; 257/306; 257/E21.208; 257/E29.164; 438/3; 438/785

(58) Field of Classification Search .......... 257/295, 257/296, 298, 300, 303, 304, 306, 307, 311, 257/E21.208, E21.436, E21.663, E21.664, 257/E29.164, E29.167, E29.272; 438/3, 438/785

See application file for complete search history.

(56) References Cited

U.S. PATENT DOCUMENTS

| | | | |
|---|---|---|---|
| 6,642,564 B2 * | 11/2003 | Ogawa et al. | 257/296 |
| 6,730,950 B1 * | 5/2004 | Seshadri et al. | 257/295 |
| 2002/0004248 A1 | 1/2002 | Lee et al. | |
| 2002/0189933 A1 * | 12/2002 | Nakamura | 204/192.18 |
| 2003/0155595 A1 * | 8/2003 | Okita | 257/295 |
| 2004/0070015 A1 | 4/2004 | Lung | |
| 2005/0189846 A1 * | 9/2005 | Saito et al. | 310/311 |
| 2006/0022241 A1 * | 2/2006 | Shimojo et al. | 257/296 |
| 2006/0137905 A1 * | 6/2006 | Kariya et al. | 174/255 |
| 2007/0045688 A1 * | 3/2007 | Sashida | 257/295 |

* cited by examiner

*Primary Examiner* — W. David Coleman
*Assistant Examiner* — Su Kim
(74) *Attorney, Agent, or Firm* — Rose Alyssa Keagy; Wade J. Brady, III; Frederick J. Telecky, Jr.

(57) ABSTRACT

A ferroelectric device employs ferroelectric electrodes as local interconnect(s). One or more circuit features are formed within or on a semiconductor body. A first dielectric layer is formed over the semiconductor body. Lower contacts are formed within the first dielectric layer. A bottom electrode is formed over the first dielectric layer and on the lower contacts. A ferroelectric layer is formed on the bottom electrode. A top electrode is formed on the ferroelectric layer. A second dielectric layer is formed over the first dielectric layer. Upper contacts are formed within the second dielectric layer and in contact with the top electrode. Conductive features are formed on the upper contacts.

19 Claims, 7 Drawing Sheets

US 8,247,855 B2

ENHANCED LOCAL INTERCONNECTS EMPLOYING FERROELECTRIC ELECTRODES

FIELD OF INVENTION

The present invention relates generally to semiconductor memory devices and more particularly to memory structures and methods for forming local interconnects employing one or more electrodes of ferroelectric capacitors in ferroelectric memory devices.

BACKGROUND OF THE INVENTION

A variety of memory types are employed in semiconductor devices and integrated circuits. One type of memory gaining in use is ferroelectric memory, which is a non-volatile memory in that stored data is maintained without power and/or frequent refresh cycles.

A ferroelectric memory cell employs a ferroelectric capacitor and, for example, a (metal oxide semiconductor) MOS transistor. The construction can be similar to the storage cell of a DRAM. However, the ferroelectric capacitor employs a ferroelectric material as a dielectric layer between top and bottom electrodes. This ferroelectric material has a high dielectric constant and can be polarized by an electric field. The polarization remains until an opposite electrical field reverses it. This makes the memory non-volatile.

Ferroelectric materials are characterized by a reversible polarization in the absence of an electric field. The polarization in a ferroelectric material arises from a noncentrosymmetric arrangement of ions in its unit cell that produces an electric dipole moment. Adjacent unit cells tends to polarize in the same direction and form a region called a ferroelectric domain.

In principle, the operation of ferroelectric memory devices is based on the hysteretic behavior of polarization with electric field. When an external voltage is applied to a ferroelectric capacitor, there is a net ionic displacement in the unit cells of the ferroelectric material. The individual unit cells interact constructively with their neighbors to produce domains within the material. As voltage is removed, the majority of the domains will remain poled in the direction of applied field, requiring compensation charge to remain on the plates of the capacitor. It is this compensation charge that causes the hysterisis in the polarization with applied external voltage. For example, at zero applied field, there are two states of polarization. Either of these two states could be encoded as a "1" or a "0" and since no external field is required to maintain these states, the memory device is nonvolatile. To switch the state of the device, an applied voltage greater than a threshold amount is required. The direction of the applied voltage results in one of the two states of polarization.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the present invention facilitate ferroelectric memory devices by employing top and/or bottom electrodes as local interconnects. The top and/or bottom electrodes are employed with contacts for local interconnects between various circuit features and conductive features within the devices. As a result, employment of metallization layers for local interconnects can be mitigated.

In accordance with one aspect of the invention, a ferroelectric device employs ferroelectric electrodes as local interconnect(s). One or more circuit features are formed within or on a semiconductor body. A first dielectric layer is formed over the semiconductor body. Lower contacts are formed within the first dielectric layer. A bottom electrode is formed over the first dielectric layer and on the lower contacts. A ferroelectric layer is formed on the bottom electrode. A top electrode is formed on the ferroelectric layer. A second dielectric layer is formed over the first dielectric layer. Upper contacts are formed within the second dielectric layer and in contact with the top electrode. Conductive features are formed on the upper contacts.

In accordance with one aspect of the invention, a method of forming a ferroelectric device is disclosed. A semiconductor body or substrate is provided. An isolation region is formed therein. A gate stack is formed on the semiconductor body. First and second active regions are formed within the semiconductor body. An interlevel dielectric layer is formed over the semiconductor body. First and second contacts are formed within the interlevel dielectric layer. A ferroelectric capacitor is formed over the interlevel dielectric layer. A second dielectric layer is formed over the first dielectric layer and the ferroelectric capacitor. First and second rectangular contacts are formed within the second dielectric layer. A metallization layer is formed over the second dielectric layer, the metallization layer comprising conductive features formed on the first and second rectangular contacts. Other devices and methods are disclosed.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

Figure 1A:
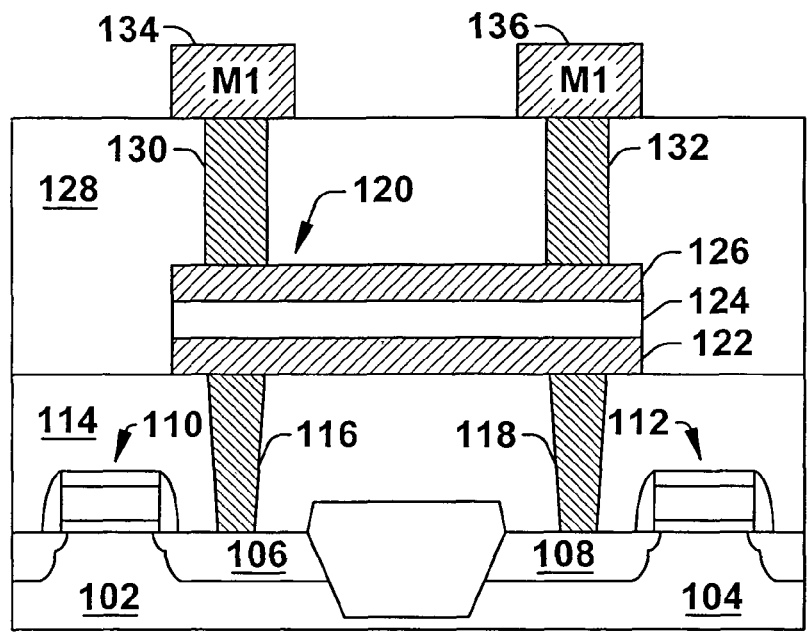
FIG. 1A is a cross sectional view illustrating a ferroelectric memory device in accordance with an aspect of the present invention.

FIG. 1A is a cross sectional view illustrating a ferroelectric memory device 100 in accordance with an aspect of the present invention. The view is provided as an example and is not intended to limit aspects of the invention to that which is illustrated and described. In this view, top and bottom electrodes are both employed as interconnects for features.

The device 100 includes a first portion 102 of a semiconductor body and a second portion 104 of a semiconductor body. The first portion 102 can include one or more semiconductor layers, well regions, and the like. The second portion 104 can also include one or more semiconductor layers, well regions, and the like. An active region or source/drain region 106 is formed within the first portion 102 and a second source/drain region 108 is formed within the second portion 104. A first gate structure 110 is formed over/on the first portion 102 and comprises a gate electrode, such as a polysilicon layer, formed on a gate dielectric layer and sidewall structures. A second gate structure 112 is formed over/on the second portion 104 and also comprises a gate electrode and sidewall structures.

An interlevel dielectric layer 114 is formed over the first portion 102 and the second portion 104. A first contact 116 is formed within the interlevel dielectric layer 114 by etching a hole and filling with a conductive material, such as tungsten. The first contact 116 is in electrical contact with the active region 106. Although not shown, a metal barrier layer can be formed around the first contact 116. Additionally, a silicide region, also not shown, can be formed at a surface of the active region 106, below the contact 116 in order to reduce contact resistance. A second contact 118 is also formed within the interlevel dielectric layer 114 by etching a hole and filling with a conductive material, such as tungsten. The second contact 118 is in electrical contact with the second active region 108. Although not shown, a metal barrier layer can be formed around the second contact 118. Additionally, a silicide region, also not shown, can be formed at a surface of the active region 108, below the contact 118 in order to reduce contact resistance.

A ferroelectric capacitor 120 is formed over the dielectric layer 114. The ferroelectric capacitor 120 comprises a bottom electrode 122, a ferroelectric layer 124, and a top electrode 126. The bottom electrode 122 is comprised of a conductive material(s), such as a noble metal such as Pt, Au, Ru, Iridium and/or conductive oxides such as, Iridium oxide, RuOx, SrRuO3, LaNiO3 or LaSrCoO3 and the like and is formed so as to be in electrical contact with the first contact 116 and the second contact 118. Although not shown, a barrier layer or diffusion barrier layer can be formed under the bottom electrode, for example to mitigate diffusion. An example of a suitable diffusion barrier layer is TiAlN, TiN or TaSiN.

The ferroelectric layer 124 is formed on the bottom electrode 122 and is comprised of a ferroelectric material. Some examples of suitable ferroelectric materials include Pb(Zr,Ti)O3 PZT (lead zirconate titanate), doped PZT with donors (Nb, La, Ta) acceptors (Mn, Co, Fe, Ni, Al) and/or both, PZT doped and alloyed with SrTiO3, BaTiO3 or CaTiO3, strontium bismuth tantalate (SBT) and other layered perovskites such as strontium bismuth niobate tantalate (SBNT) or bismuth titanate, BaTiO3, PbTiO3, Bi2TiO3, and the like. Generally, the ferroelectric material exhibits ferroelectric properties and has a suitable polarization and processing temperature.

The top electrode 126 is formed on the ferroelectric layer 124 and is comprised of a conductive material. Some examples of suitable materials that can be employed for the top electrode include, for example, a noble metal such as Pt, Ru, Au, Pd or Ir and/or conductive oxide such as iridium, iridium oxide, Pt, Pd, PdOx, Au, Ru, RuOx, Rh, RhOx, LaSrCoO3, (Ba, Sr)RuO3, LaNiO3 or any stack or combination thereof. The top electrode can also have another layer on top that acts as a conductive diffusion barrier. Example materials are TiN, TiAlN, Ta, TaN, TiW, WN, etc.

It is noted that the capacitor can, for example, be formed using a single mask and all of the layers in the capacitor can thus be etched using that single mask. Sometimes such an etch requires the use of a hardmask such as SiOx, SiN, W, WN, Ti, TiN, or TiAlN. Since a single mask is used to define the capacitor, the top electrode and bottom electrode have the same shape/location. This requirement does not exist if the capacitor is made with multiple masks to pattern the different layers. Thus, although FIG. 1 depicts the bottom electrode 122 and the top electrode 124 as having similar dimensions, aspects of the invention can have tope and bottom electrodes of varying dimensions.

The ferroelectric capacitor 120 is formed within a second dielectric layer 128, which can also be an interlayer dielectric layer. The second dielectric layer 128 is comprised of a suitable dielectric material. This dielectric layer 128 can, for example, be composed of multiple dielectric layers. For example the bottom layer might be a diffusion barrier such as AlOx and/or TiOx. Further dielectrics might be SiN as an etch stop followed by other dielectrics such as SiO2, FSG, HSQ, or other low-K dielectric such as AMAT Black Diamond. A third contact 130 is formed within the second dielectric layer 128 and is in electrical contact with the top electrode 126. A fourth contact 132 is also formed within the second dielectric layer 128 and is also in electrical contact with the top electrode 126. The third contact 130 and the fourth contact 132 can also be referred to as upper contacts.

A first portion 134 of a metallization layer is located over the third contact 130 and is in electrical contact with the third contact 130. A second portion 136 of the metallization layer is located over the fourth contact 132 and is in electrical contact with the fourth contact 132. The first portion 134 and the second portion 136 can also be referred to as conductive features. The top electrode 126 operates as a local interconnect between the first portion 134 and the second portion 136 of the metallization layer. A conductive path results that comprises the first portion 134, the third contact 130, the top electrode 126, the fourth contact 132, and the second portion 136.

Similarly, the bottom electrode 122 operates as a local interconnect for the first active region 106 and the second active region 108. Another conductive path results that comprises the first active region 106, the first contact 116, the bottom electrode 122, the second contact 118, and the second active region 108.

By employing the top electrode 126 and the bottom electrode 122 as local interconnects, formation of interconnects and/or metallization layers can be reduced. For example, without employing the tope electrode 126 and the bottom electrode 122 as local interconnects, a second metallization layer could be required to make the same electrical connections. Additionally, such interconnects and metallization layers could have longer paths and, as a result, larger resistance and/or capacitance. Thus, employing the top electrode 126 and the bottom electrode 122 as local interconnects can also facilitate performance of the device.

Figure 1B:
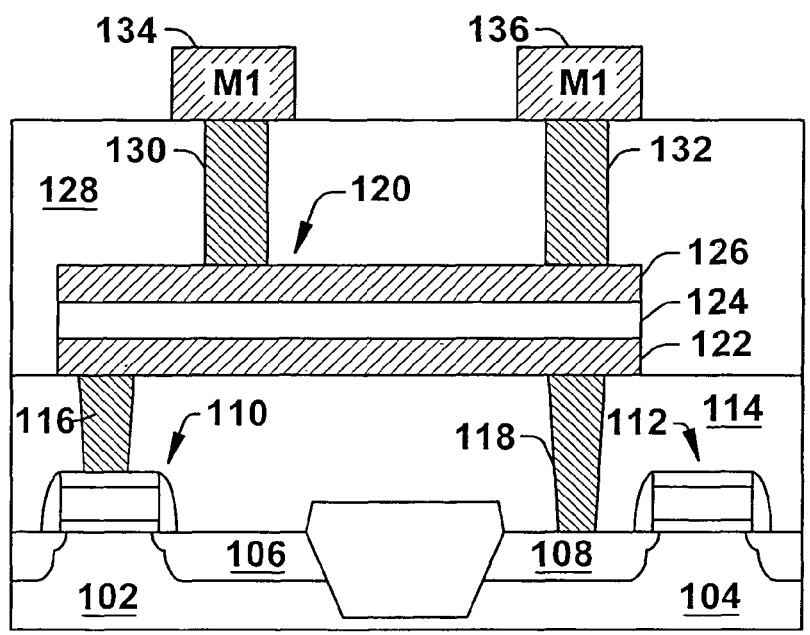
FIG. 1B is a cross sectional view illustrating a ferroelectric memory device in accordance with an aspect of the present invention.

FIG. 1B is a cross sectional view illustrating a ferroelectric memory device 100 in accordance with an aspect of the present invention. The view is provided as an example and is not intended to limit aspects of the invention to that which is illustrated and described. In this view, top and bottom electrodes are both employed as interconnects for features. This view is similar to that of FIG. 1A, however the bottom electrode is employed as an interconnect to a gate electrode. As a result, some duplicated description is omitted in the below description and the above description for FIG. 1A can be referenced for additional details.

The device 100 includes a first portion 102 of a semiconductor body and a second portion 104 of a semiconductor body. The first portion 102 can include one or more semiconductor layers, well regions, and the like. The second portion 104 can also include one or more semiconductor layers, well regions, and the like. An active region or source/drain region 106 is formed within the first portion 102 and a second source/drain region 108 is formed within the second portion 104. A first gate structure 110 is formed over/on the first portion 102 and comprises a gate electrode, such as a polysilicon layer, and sidewall structures. A second gate structure 112 is formed over/on the second portion 104 and also comprises a gate electrode and sidewall structures. The gate structures and active regions are examples of circuit features.

An interlevel dielectric layer 114 is formed over the first portion 102 and the second portion 104. A first contact 116 is formed within the interlevel dielectric layer 114 and over/on the first gate structure 110 by etching a hole and filling with a conductive material, such as tungsten. The first contact 116 is in electrical contact with the gate 110.

A second contact 118 is also formed within the interlevel dielectric layer 114 by etching a hole and filling with a conductive material, such as tungsten. The second contact 118 is in electrical contact with the second active region 108. Although not shown, a metal barrier layer can be formed around the second contact 118. Additionally, a silicide region, also not shown, can be formed at a surface of the active region 108, below the contact 118 in order to reduce contact resistance. The first and second contacts 116, 118 are also referred to as lower contacts.

A ferroelectric capacitor 120 is formed over the dielectric layer 114. The ferroelectric capacitor 120 comprises a bottom electrode 122, a ferroelectric layer 124, and a top electrode 126. The bottom electrode 122 is comprised of a conductive material, such as a noble metal, Iridium, Iridium oxide, and the like and is formed so as to be in electrical contact with the first contact 116 and the second contact 118. Although not shown, a barrier layer or diffusion barrier layer can be formed under the bottom electrode, for example to mitigate diffusion.

The ferroelectric layer 124 is formed on the bottom electrode 122 and is comprised of a ferroelectric material. Generally, the ferroelectric material exhibits ferroelectric properties and has a suitable polarization and processing temperature.

The top electrode 126 is formed on the ferroelectric layer 124 and is comprised of a conductive material, such as a noble metal, Iridium, Iridium oxide, and the like. The ferroelectric capacitor 120 is formed or located within a second dielectric layer 128, such an interlayer dielectric layer. The second dielectric layer 128 is comprised of a suitable dielectric material.

A third contact 130 is formed within the second dielectric layer 128 and is in electrical contact with the top electrode 126. A fourth contact 132 is also formed within the second dielectric layer 128 and is also in electrical contact with the top electrode 126.

A first portion 134 of a metallization layer is located over the third contact 130 and is in electrical contact with the third contact 130. A second portion 136 of the metallization layer is located over the fourth contact 132 and is in electrical contact with the fourth contact 132. The top electrode 126 operates as a local interconnect between the first portion 134 and the second portion 136 of the metallization layer. A conductive path results that comprises the first portion 134, the third contact 130, the top electrode 126, the fourth contact 132, and the second portion 136.

The bottom electrode 122 operates as a local interconnect for the first gate 110 and the second active region 108. Another conductive path results that comprises the first gate 110, the first contact 116, the bottom electrode 122, the second contact 118, and the second active region 108.

As stated previously, employing the top electrode 126 and the bottom electrode 122 as local interconnects can reduce required formation of other interconnects and/or metallization layers that would otherwise be required.

Figure 2A:
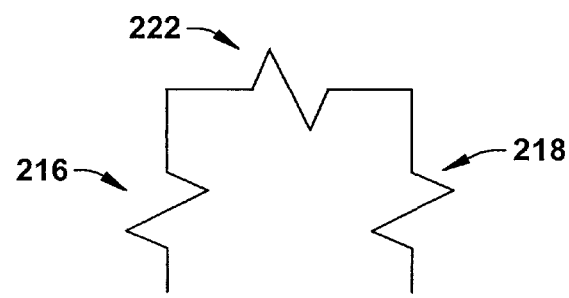
FIG. 2A is a schematic circuit diagram illustrating a local interconnect employing an electrode of a ferroelectric capacitor in accordance with an aspect of the present invention.

FIG. 2A is a schematic circuit diagram 200 illustrating a local interconnect employing an electrode of a ferroelectric capacitor in accordance with an aspect of the present invention. The diagram 200 is provided as an example of a circuit estimating operational characteristics of local interconnects employing ferroelectric capacitor electrodes as appreciated by the inventors of the present invention.

In this example, a local interconnect comprises a first contact, an electrode, and a second contact, such as shown in FIG. 1A. The first contact has an associated estimated first resistance 216. The second contact has an associated estimated second resistance 218. Additionally, the electrode has an associated estimated electrode resistance 222.

The first contact, the electrode, and the second contact are connected in series and thus, the local interconnect has a resistance equal to a sum of the first resistance 216, the second resistance 218, and the electrode resistance 222, in this example. The resistance, in one example, can be considered when determining device performance characteristics.

Figure 2B:
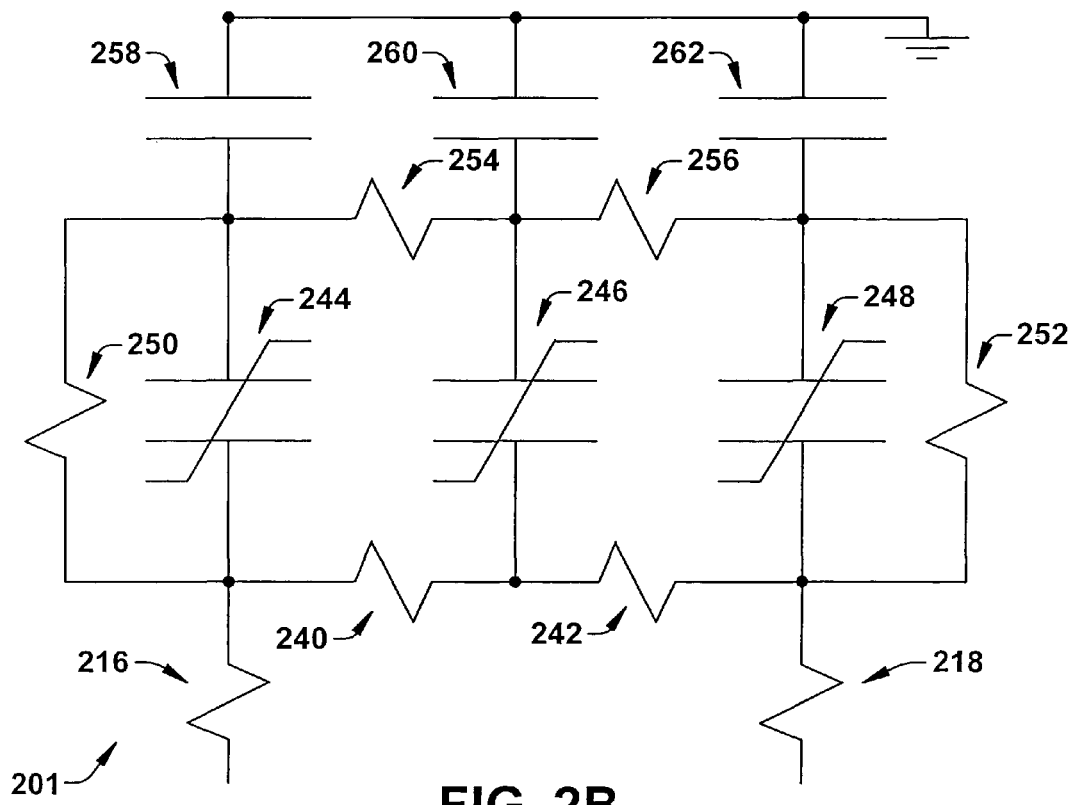
FIG. 2B is a schematic circuit diagram illustrating a local interconnect employing an electrode of a ferroelectric capacitor in accordance with an aspect of the present invention.

FIG. 2B is a schematic circuit diagram 201 illustrating a local interconnect employing an electrode of a ferroelectric capacitor in accordance with an aspect of the present invention. The diagram 200 is provided as an example of a circuit estimating operational characteristics of local interconnects employing ferroelectric capacitor electrodes as appreciated by the inventors of the present invention.

In this example, a local interconnect comprises a first contact, a bottom electrode, and a second contact, such as shown in FIG. 1A. A ferroelectric capacitor comprises the bottom electrode, a ferroelectric layer, and a top electrode, also as shown in FIG. 1A. The first contact has an associated estimated first resistance 216 and the second contact has an associated estimated second resistance 218. However, the operational characteristics of the electrode, in this example, are shown differently than as in FIG. 2A. Other factors are considered.

The inventors of the present invention note that the ferroelectric capacitor can also be described as a series resistor/capacitor hooked up to the top electrode and surround components through an interlevel dielectric layer or other dielectric layer. In addition, the ferroelectric capacitor has a leakage component through the bulk plus a perimeter of the ferroelectric capacitors.

As a result, other portions of the ferroelectric capacitor besides the bottom electrode contribute to operational characteristics of the local interconnect. In this example, the bottom electrode is represented by first and second bottom electrode resistances 240 and 242 connected as shown. The top electrode is represented by first and second tope electrode resistances 254 and 256. The interlevel dielectric layer is represented by first, second, and third dielectric capacitances 258, 260, and 262, connected as shown. The ferroelectric layer is represented by ferroelectric capacitances 244, 246, and 248, also connected as shown. Parasitic capacitance or leakage through the bulk and/or perimeter of the ferroelectric capacitor is represented by first and second parasitic resistances 250 and 252.

These operational characteristics can then be employed to yield interconnects with selected resistance and capacitance values. It is noted that the formation, dimensions, and composition of the ferroelectric capacitor, including electrodes and ferroelectric layer, as well as the contacts and dielectric layer can be altered to yield selected resistance and capacitance values.

These operational characteristics can then be employed to yield interconnects with selected resistance and capacitance values. It is noted that the formation, dimensions, and composition of the ferroelectric capacitor, including electrodes and ferroelectric layer, as well as the contacts and dielectric layer can be altered to yield selected resistance and capacitance values. For example, it is therefore possible to use the top and/or bottom electrodes of the capacitor as a resistor if needed by controlling the total length and width of the electrode.

Using the capacitor as a local interconnect will allow the different active components in the substrate transistors or diodes to be connected without using upper levels of metal. Doing so will either allow the circuit to be smaller since the various devices can be hooked up in less area or perhaps eliminate the need for an extra metal layer (less likely since the resistivity in this layer is probably too high to be used for long distance interconnect).

Figure 3:
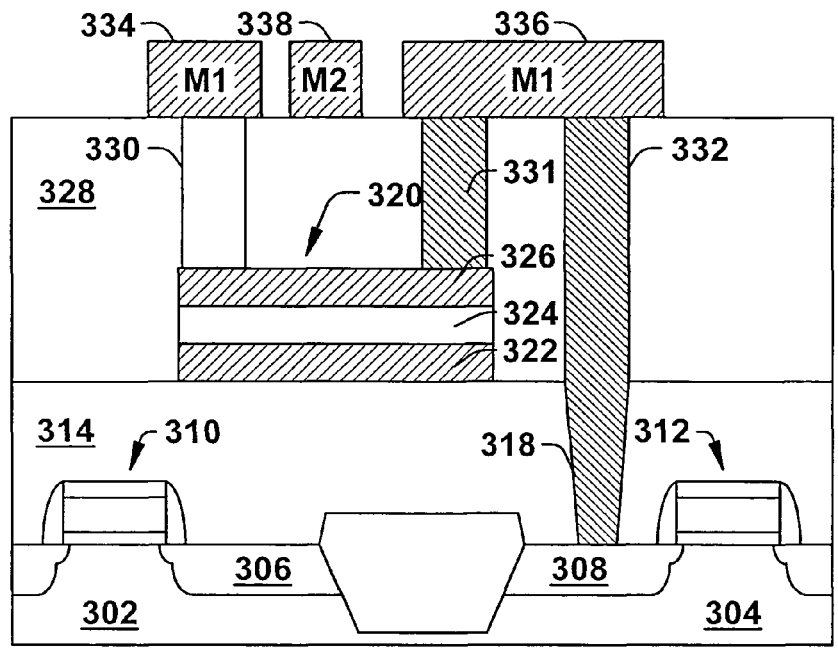
FIG. 3 is a cross sectional view illustrating a ferroelectric memory device in accordance with an aspect of the present invention.

FIG. 3 is a cross sectional view illustrating a ferroelectric memory device 300 in accordance with an aspect of the present invention. The view is provided as an example and is not intended to limit aspects of the invention to that which is illustrated and described. In this view, a top electrode is employed as a local interconnect from a metallization layer to an active region.

Some of the details are omitted for brevity and can be found above.

The device 300 includes a first portion 302 of a semiconductor body and a second portion 304 of a semiconductor body. The first portion 302 can include one or more semiconductor layers, well regions, and the like. The second portion 304 can also include one or more semiconductor layers, well regions, and the like. An active region or source/drain region 306 is formed within the first portion 302 and a second source/drain region 308 is formed within the second portion 304. A first gate structure 310 is formed over/on the first portion 302 and comprises a gate electrode, such as a polysilicon layer, and sidewall structures. A second gate structure 312 is formed over/on the second portion 304 and also comprises a gate electrode and sidewall structures.

An interlevel dielectric layer 314 is formed over the first portion 302 and the second portion 304. A first contact 318 is formed within the interlevel dielectric layer 314 by etching a hole and filling with a conductive material, such as tungsten. The first contact 318 is in electrical contact with the second active region 308, in this example.

A ferroelectric capacitor 320 is formed over/on the dielectric layer 314. The ferroelectric capacitor 320 comprises a bottom electrode 322, a ferroelectric layer 324, and a top electrode 326. The bottom electrode 322 is comprised of a conductive material, such as a noble metal, Iridium, Iridium oxide, and the like and is formed so as to be in electrical contact with the first contact 318 and the second active region 308. Although not shown, a barrier layer or diffusion barrier layer can be formed under the bottom electrode, for example to mitigate diffusion.

The ferroelectric layer 324 is formed on the bottom electrode 322 and is comprised of a ferroelectric material. Some examples of suitable ferroelectric materials include $Pb(Zr, Ti)O_3$ PZT (lead zirconate titanate), doped PZT with donors (Nb, La, Ta) acceptors (Mn, Co, Fe, Ni, Al) and/or both, PZT doped and alloyed with $SrTiO3$, $BaTiO3$ or $CaTiO3$, strontium bismuth tantalate (SBT) and other layered perovskites such as strontium bismuth niobate tantalate (SBNT) or bismuth titanate, $BaTiO3$, $PbTiO3$, $Bi2TiO3$, and the like. Generally, the ferroelectric material exhibits ferroelectric properties and has a suitable polarization and processing temperature.

The top electrode 326 is formed on the ferroelectric layer 324 and is comprised of a conductive material. Some examples of suitable materials that can be employed for the top electrode include, for example, a noble metal or conductive oxide such as iridium, iridium oxide, Pt, Pd, PdOx, Au, Ru, $RuO_x$, Rh, $RhO_x$, $LaSrCoO_3$, $(Ba, Sr)RuO_3$, $LaNiO_3$ or any stack or combination thereof.

The ferroelectric capacitor 320 is formed within a second dielectric layer 328, which can also be an interlayer dielectric layer. The second dielectric layer 328 is comprised of a suitable dielectric material. A second contact 330 (or via) is formed within the second dielectric layer 328 and is in electrical contact with the top electrode 326. A third contact 331 is also formed within the second dielectric layer 328 and is also in electrical contact with the top electrode 326. A fourth contact 332 is formed within the second dielectric layer 328 and on the first contact 318. The fourth contact 332 is in electrical contact with the first contact 318 and, can exist as a single, continuous contact.

A first portion 334 of a metallization layer is located over the second contact 330 and is in electrical contact with the second contact 330. A second portion 336 of the metallization layer is located over the fourth contact 332 and the third contact 331 and is in electrical contact with the third contact 331 and the fourth contact 332. A third portion 338 of the metailization layer is electrically isolated from the first portion 334 and the second portion 336.

The top electrode 326 operates as part of a local interconnect between the first portion 334 and the second active region 308. A conductive path results that comprises the first portion 334, the second contact 330, the top electrode 326, the third contact 331, the second portion 336 of the metallization layer, the fourth contact 332, and the first contact 318.

Figure 4:
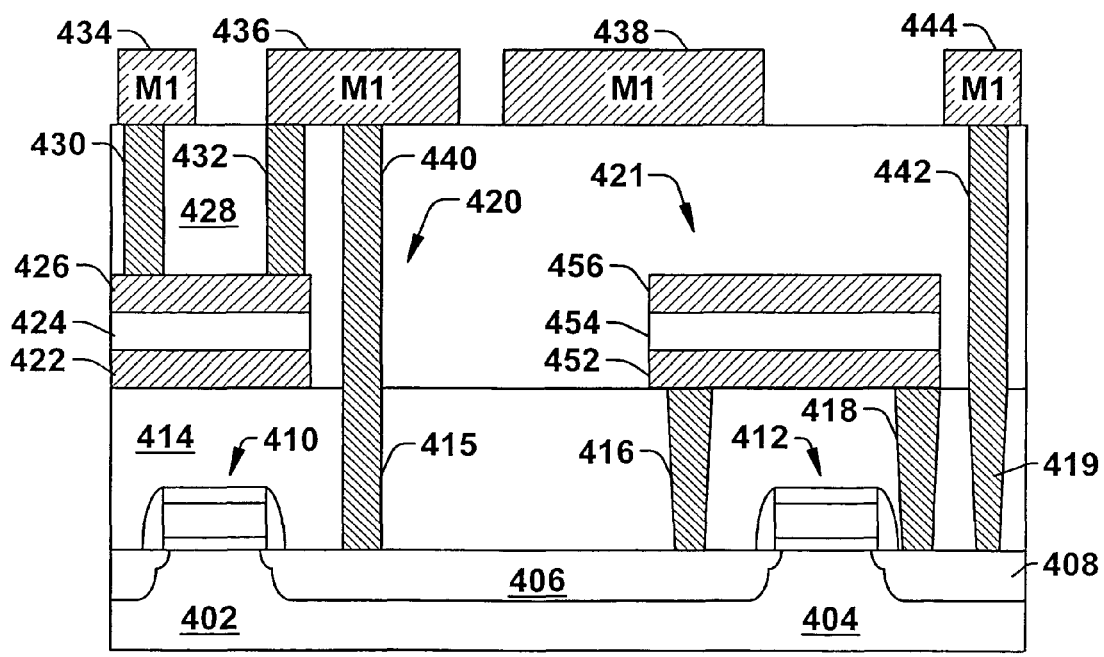
FIG. 4 is a cross sectional view illustrating a ferroelectric memory device in accordance with an aspect of the present invention.

FIG. 4 is a cross sectional view illustrating a ferroelectric memory device 400 in accordance with an aspect of the present invention. The view is provided as an example and is not intended to limit aspects of the invention to that which is illustrated and described. In this view, a top electrode of one capacitor and a bottom electrode of another are employed to form a local interconnect from a portion of a metallization layer to another portion of the metallization layer.

The device 400 includes a first portion 402 of a semiconductor body and a second portion 404 of a semiconductor body. The first portion 402 and the second portion 404 can include one or more semiconductor layers, well regions, and the like. A first active region or source/drain region 406 is formed within the first portion 402 and the second portion 404. A second active region 408 is formed within the second portion 404 opposite the first active region 406. A first gate structure 410 is formed over/on the first portion 402 and comprises a gate electrode, such as a polysilicon layer, and sidewall structures. A second gate structure 412 is formed over/on the second portion 404 and also comprises a gate electrode and sidewall structures.

An interlevel dielectric layer 414 is formed over the first portion 402 and the second portion 404. A first contact 415 is formed within the interlevel dielectric layer 414 by etching a hole and filling with a conductive material, such as tungsten. The first contact 415 is in electrical contact with the active region 406. A second contact 416 is also formed within the interlevel dielectric layer 414 by etching a hole and filling with a conductive material. The second contact 416 is also in electrical contact with the first active region 406, however the second contact 416 is positioned toward the second gate structure 412. A third contact 418 and fourth contact 419 are formed within the dielectric layer 414 and are in electrical contact with the second active region 408. The third contact 418 is positioned near to the second gate structure 412 than the fourth contact 419.

A second ferroelectric capacitor 421 is formed over the dielectric layer 414. The ferroelectric capacitor 421 comprises a bottom electrode 452, a ferroelectric layer 454, and a top electrode 456. The bottom electrode 452 is comprised of a conductive material, such as a noble metal, Iridium, Iridium oxide, and the like and is formed so as to be in electrical contact with the second contact 416 and the third contact 418. Although not shown, a barrier layer or diffusion barrier layer can be formed under the bottom electrode, for example to mitigate diffusion.

The ferroelectric layer 454 is formed on the bottom electrode 452 and is comprised of a ferroelectric material. Some examples of suitable ferroelectric materials include Pb(Zr,Ti)$O_3$ PZT (lead zirconate titanate), doped PZT with donors (Nb, La, Ta) acceptors (Mn, Co, Fe, Ni, Al) and/or both, PZT doped and alloyed with SrTiO3, BaTiO3 or CaTiO3, strontium bismuth tantalate (SBT) and other layered perovskites such as strontium bismuth niobate tantalate (SBNT) or bismuth titanate, BaTiO3, PbTiO3, Bi2TiO3, and the like. Generally, the ferroelectric material exhibits ferroelectric properties and has a suitable polarization and processing temperature.

The top electrode 456 is formed on the ferroelectric layer 424 and is comprised of a conductive material. Some examples of suitable materials that can be employed for the top electrode include, for example, a noble metal or conductive oxide such as iridium, iridium oxide, Pt, Pd, PdOx, Au, Ru, RuO$_x$, Rh, RhO$_x$, LaSrCoO$_3$, (Ba,Sr)RuO$_3$, LaNiO$_3$ or any stack or combination thereof.

Similarly, a first ferroelectric capacitor 420 is formed over the dielectric layer 414. The ferroelectric capacitor 420 comprises a bottom electrode 422, a ferroelectric layer 424, and a top electrode 426.

The first ferroelectric capacitor 420 and second ferroelectric capacitor 421 are formed within a second dielectric layer 428, which can also be an interlayer dielectric layer. The second dielectric layer 428 is comprised of a suitable dielectric material. A fifth contact 430 (or via) is formed within the second dielectric layer 428 and is in electrical contact with the top electrode 426. A sixth contact 432 is also formed within the second dielectric layer 428 and is also in electrical contact with the top electrode 426. A seventh contact 440 is formed within the second dielectric layer 428 over and in electrical contact with the first contact 415. The seventh contact 440 and the first contact 415 can be a continuous, single contact, or discrete contacts. An eighth contact 442 is also formed within the second dielectric layer over and in electrical contact with the fourth contact 419. The eighth contact 442 and the fourth contact 419 can be a continuous, single contact or separate, discrete components.

A first portion 434 of a metallization layer is located over and in electrical contact with the fifth contact 430. A second portion 436 of the metallization layer is formed over and in electrical contact with the sixth contact 432 and the seventh contact 440. A third portion 438 of the metallization layer is isolated and a fourth portion 444 is positioned over and in electrical contact with the eighth contact 442.

As a result, a local interconnect is formed between the first portion 434 and the fourth portion 444 of the metallization layer employing the top electrode 426 of the first capacitor stack 420 and the bottom electrode 452 of the second capacitor stack 421. A conductive path between the first portion 434 and the fourth portion 444 results that comprises, in series, the fifth contact 430, the top electrode 426, the sixth contact 432, the second portion 436, the seventh contact 440, the first contact 415, the first active region 406, the second contact 416, the bottom electrode 452, the third contact 418, the second active region 408, the fourth contact 419, and the eighth contact 442.

Similarly, the bottom electrode 452 operates as a local interconnect for the first active region 406 and the second active region 408. Another conductive path results that comprises the first active region 406, the second contact 416, the bottom electrode 452, the third contact 418, and the second active region 408.

By employing the top electrode 426 and the bottom electrode 452 as local interconnects, formation of interconnects and/or metallization layers can be reduced. For example, without employing the top electrode 426 and the bottom electrode 452 as local interconnects, a second metallization layer could be required to make the same electrical connections. Additionally, such interconnects and metallization layers could have longer paths and, as a result, larger resistance and/or capacitance. Thus, employing the top electrode 426 and the bottom electrode 452 as local interconnects can also facilitate performance of the device.

Figure 5:
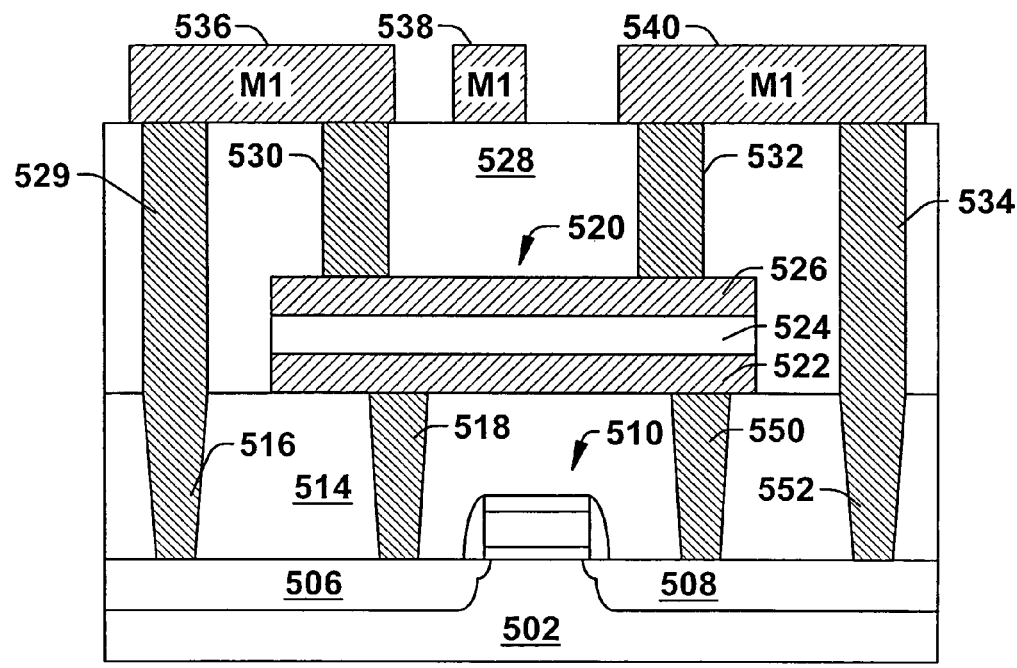
FIG. 5 is a cross sectional view illustrating a ferroelectric memory device in accordance with an aspect of the present invention.

FIG. 5 is a cross sectional view illustrating a ferroelectric memory device 500 in accordance with an aspect of the present invention. In this view, a top electrode and a bottom electrode of a capacitor are both employed for a single local interconnect. The view is provided as an example and is not intended to limit aspects of the invention to that which is illustrated and described.

The device 500 includes a portion 502 of a semiconductor body that can include one or more semiconductor layers, well regions, and the like. First and second active region or source/ drain regions 506, 508 are formed within the portion 502. A gate structure 510 is formed over/on the first portion 502 and comprises a gate electrode, such as a polysilicon layer, and sidewall structures.

An interlevel dielectric layer 514 is formed over the first portion 502 and the second portion 504. A first contact 516 is formed within the interlevel dielectric layer 514 by etching a hole and filling with a conductive material, such as tungsten. The first contact 516 is in electrical contact with the active region 506. A second contact 518 is also formed within the interlevel dielectric layer 514 by etching a hole and filling with a conductive material. The second contact 518 is also in electrical contact with the first active region 506, however the second contact 516 is positioned toward the gate structure 510. A third contact 550 and fourth contact 552 are formed within the dielectric layer 514 and are in electrical contact with the second active region 508. The third contact 550 is positioned nearer to the second gate structure 510 than the fourth contact 552.

A ferroelectric capacitor 520 is formed over the dielectric layer 514. The ferroelectric capacitor 520 comprises a bottom electrode 522, a ferroelectric layer 524, and a top electrode 526. The bottom electrode 522 is comprised of a conductive material, such as a noble metal, Iridium, Iridium oxide, and the like and is formed so as to be in electrical contact with the second contact 518 and the third contact 550. Although not shown, a barrier layer or diffusion barrier layer can be formed under the bottom electrode, for example to mitigate diffusion.

The ferroelectric layer 524 is formed on the bottom electrode 522 and is comprised of a ferroelectric material. Some examples of suitable ferroelectric materials include Pb(Zr,Ti)O$_3$ PZT (lead zirconate titanate), doped PZT with donors (Nb, La, Ta) acceptors (Mn, Co, Fe, Ni, Al) and/or both, PZT doped and alloyed with SrTiO3, BaTiO3 or CaTiO3, strontium bismuth tantalate (SBT) and other layered perovskites such as strontium bismuth niobate tantalate (SBNT) or bismuth titanate, BaTiO3, PbTiO3, Bi2TiO3, and the like. Generally, the ferroelectric material exhibits ferroelectric properties and has a suitable polarization and processing temperature.

The top electrode 526 is formed on the ferroelectric layer 524 and is comprised of a conductive material. Some examples of suitable materials that can be employed for the top electrode include, for example, a noble metal or conductive oxide such as iridium, iridium oxide, Pt, Pd, PdOx, Au, Ru, RuO$_x$, Rh, RhO$_x$, LaSrCoO$_3$, (Ba, Sr)RuO$_3$, LaNiO$_3$ or any stack or combination thereof.

The ferroelectric capacitor 520 is formed within a second dielectric layer 528, which can also be an interlayer dielectric layer. The second dielectric layer 528 is comprised of a suitable dielectric material. A fifth contact 529 (or via) is formed over the first contact 516 within the second dielectric layer 528 and is in electrical contact with the first contact 516. The fifth contact 529 and the first contact 516 can comprise a continuous, single contact. A sixth contact 530 is formed over and in contact with the top electrode 526. A seventh contact 532 is also formed over and in contact with the top electrode 526, as shown in FIG. 5. The seventh contact 532 is positioned toward an opposite end of the capacitor 520 from the sixth contact 530. An eighth contact 534 is formed over and in electrical contact with the fourth contact 552.

A first portion 536 of a metallization layer is located over and in electrical contact with the fifth contact 529 and the sixth contact 530. A second portion 538 of the metallization layer is formed over to ferroelectric capacitor 520 and is electrically isolated from the first portion 536. A third portion 540 of the metallization layer is positioned over and in electrical contact with the seventh contact 532 and the eighth contact 534.

As a result, a local interconnect is formed between the first portion 536 and the third portion 540 of the metallization layer employing the top electrode 526 and the bottom electrode 522 of the ferroelectric capacitor stack 520. The local interconnect comprises to parallel conductive paths, in this example. A first conductive path between the first portion 536 and the third portion 540 comprises, in series, the fifth contact 529, the first contact 516, the first active region 506, the second contact 518, the bottom electrode 522, the third contact 550, the second active region 508, the fourth contact 552, and the eighth contact 534. A second conductive path between the first portion 536 and the third portion 540 comprises, in series, the sixth contact 530, the top electrode 526, and the seventh contact 532.

The local interconnect, in this example, can have lower resistance and superior performance because of the two paths employing both the top and bottom electrodes 526, 522. However, this example obtains this lower resistance at a cost of increased area usage.

Figure 6:
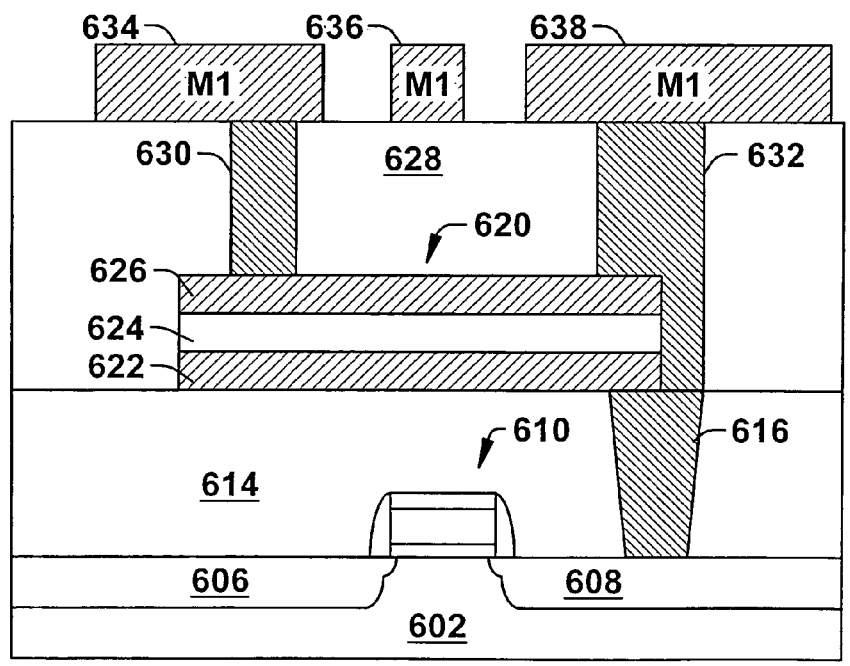
FIG. 6 is a cross sectional view illustrating a ferroelectric memory device in accordance with an aspect of the present invention.

FIG. 6 is a cross sectional view illustrating a ferroelectric memory device 600 in accordance with an aspect of the present invention. In this view, a top electrode and a bottom electrode of a capacitor are both employed for a single local interconnect. The view is provided as an example and is not intended to limit aspects of the invention to that which is illustrated and described.

The device 600 includes a portion 602 of a semiconductor body that can include one or more semiconductor layers, well regions, and the like. First and second active region or source/drain regions 606, 608 are formed within the portion 602. A gate structure 610 is formed over/on the first portion 602 and comprises a gate electrode, such as a polysilicon layer, and sidewall structures.

An interlevel dielectric layer 614 is formed over the first portion 602. A first contact 616 is formed within the interlevel dielectric layer 614 by etching a hole and filling with a conductive material, such as tungsten. The first contact 616 is in electrical contact with the active region 608. The first contact 616 is depicted as being narrower at a bottom portion only as an example. The first contact 616 can have other shapes and characteristics suitable for contacts in semiconductor devices.

A ferroelectric capacitor 620 is formed over the dielectric layer 614. The ferroelectric capacitor 620 comprises a bottom electrode 622, a ferroelectric layer 624, and a top electrode 626. The bottom electrode 622 is comprised of a conductive material, such as a noble metal, Iridium, Iridium oxide, and the like and is formed so as to be in electrical contact with the first contact 616. Although not shown, a barrier layer or diffusion barrier layer can be formed under the bottom electrode, for example to mitigate diffusion.

The ferroelectric layer 624 is formed on the bottom electrode 622 and is comprised of a ferroelectric material. Some examples of suitable ferroelectric materials include Pb(Zr,Ti)O$_3$ PZT (lead zirconate titanate), doped PZT with donors (Nb, La, Ta) acceptors (Mn, Co, Fe, Ni, Al) and/or both, PZT doped and alloyed with SrTiO3, BaTiO3 or CaTiO3, strontium bismuth tantalate (SBT) and other layered perovskites such as strontium bismuth niobate tantalate (SBNT) or bismuth titanate, BaTiO3, PbTiO3, Bi2TiO3, and the like. Generally, the ferroelectric material exhibits ferroelectric properties and has a suitable polarization and processing temperature.

The top electrode 626 is formed on the ferroelectric layer 624 and is comprised of a conductive material. Some examples of suitable materials that can be employed for the top electrode include, for example, a noble metal or conductive oxide such as iridium, iridium oxide, Pt, Pd, PdOx, Au, Ru, RuO$_x$, Rh, RhO$_x$, LaSrCoO$_3$, (Ba, Sr)RuO$_3$, LaNiO$_3$ or any stack or combination thereof.

The ferroelectric capacitor 620 is formed within a second dielectric layer 628, which can also be an interlayer dielectric layer. The second dielectric layer 628 is comprised of a suitable dielectric material. A second contact (or via) 630 is formed over the top electrode 626 and is in electrical contact with the top electrode 626. A rectangular contact 632 is formed over the top electrode 626 and the first contact 616 and is in electrical contact with both the top electrode 626 and the first contact 616. The rectangular contact 632 is relatively wider in one dimension as shown in FIG. 6, so as to contact multiple features at the same time, which in this example includes the top electrode 626, the bottom electrode 622, and the first contact 616. By using a rectangular contact it is possible to make an electrical connection between the bottom or top electrode of the capacitor with another contact also next to or partially under the capacitor. This will hold true even considering the experimental misalignment between the various layers that can occur in production.

Standard contacts are usually circular after etch but are frequently drawn as square. The inventors of the present invention realize that non-standard shaped contacts, such as rectangular contacts and/or other variations can be employed.

A first portion 634 of a metallization layer is located over and in electrical contact with the second contact 630. A second portion 636 of the metallization layer is formed over to ferroelectric capacitor and is electrically isolated from the first portion 636. A third portion 638 of the metallization layer is positioned over and in electrical contact with the rectangular contact 632.

As a result, a local interconnect is formed between the first portion 634, the third portion 638, and the second active region 608 employing both the top electrode 626 and the bottom electrode 622 of the ferroelectric capacitor stack 620. The local interconnect comprises a conductive path, in series, the second contact 630, the top electrode 626, the rectangular contact fifth contact 632, the bottom electrode 622 and the first contact 616. The rectangular contact 632 permits simultaneous contact to the top electrode 626, the bottom electrode 622, and the first contact 616.

It is noted that alternate aspects of the present invention can employ multiple rectangular contacts, for example, to facilitate interconnection, mitigate resistance, and the like.

Figure 7:
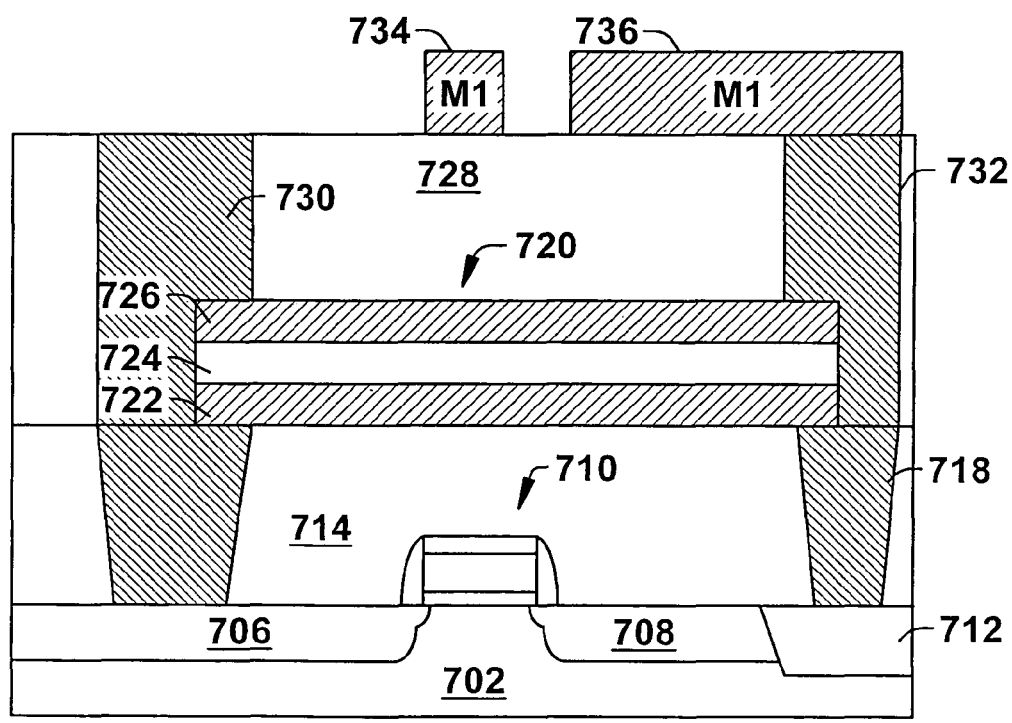
FIG. 7 is a cross sectional view illustrating a ferroelectric memory device in accordance with an aspect of the present invention.

FIG. 7 is a cross sectional view illustrating a ferroelectric memory device 700 in accordance with an aspect of the present invention. In this view, a top electrode and a bottom electrode of a capacitor are both employed with rectangular contacts for a single local interconnect. The view is provided as an example and is not intended to limit aspects of the invention to that which is illustrated and described.

The device 700 includes a portion 702 of a semiconductor body that can include one or more semiconductor layers, well regions, and the like. First and second active region or source/drain regions 706, 708 are formed within the portion 702. An isolation region 712, such as a shallow trench isolation region, is formed adjacent the second active region 708. A gate structure 710 is formed over/on the first portion 702 and comprises a gate electrode, such as a polysilicon layer, and sidewall structures.

An interlevel dielectric layer 714 is formed over the first portion 702 and the second portion 704. A first contact 716 is formed within the interlevel dielectric layer 714 by etching a hole and filling with a conductive material, such as tungsten frequently with other materials to either help as diffusion barrier such as TiN or to help improve the conductivity such as Ti. Other conductive materials such as Cu with different barriers such as Ta, TaN, TiSiN, TaSiN also possible. The first contact 716 is in electrical contact with the first active region 706. A second contact 718 is formed over the isolation region 712 and is not in contact with the second active region 708 or other feature.

A ferroelectric capacitor 720 is formed over the dielectric layer 714. The ferroelectric capacitor 720 comprises a bottom electrode 722, a ferroelectric layer 724, and a top electrode 726. The bottom electrode 722 is comprised of a conductive material, such as a noble metal, Iridium, Iridium oxide, and the like and is formed so as to be in electrical contact with the first contact 716 and the second contact 718. Although not shown, a barrier layer or diffusion barrier layer can be formed under the bottom electrode, for example to mitigate diffusion.

The ferroelectric layer 724 is formed on the bottom electrode 722 and is comprised of a ferroelectric material. Some examples of suitable ferroelectric materials include Pb(Zr, Ti)O$_3$ PZT (lead zirconate titanate), doped PZT with donors (Nb, La, Ta) acceptors (Mn, Co, Fe, Ni, Al) and/or both, PZT doped and alloyed with SrTiO3, BaTiO3 or CaTiO3, strontium bismuth tantalate (SBT) and other layered perovskites such as strontium bismuth niobate tantalate (SBNT) or bismuth titanate, BaTiO3, PbTiO3, Bi2TiO3, and the like. Generally, the ferroelectric material exhibits ferroelectric properties and has a suitable polarization and processing temperature.

The top electrode 726 is formed on the ferroelectric layer 724 and is comprised of a conductive material. Some examples of suitable materials that can be employed for the top electrode include, for example, a noble metal or conductive oxide such as iridium, iridium oxide, Pt, Pd, PdOx, Au, Ru, RuO$_x$, Rh, RhO$_x$, LaSrCoO$_3$, (Ba, Sr)RuO$_3$, LaNiO$_3$ or any stack or combination thereof.

The ferroelectric capacitor 720 is formed within a second dielectric layer 728, which can also be an interlayer dielectric layer. The second dielectric layer 728 is comprised of a suitable dielectric material. A first rectangular contact 730 is formed over and in contact with the first contact 716, the top electrode 726, and the bottom electrode 722. A second rectangular contact 732 is formed over and in contact with the second contact 718, the top electrode 726, and the bottom electrode 722.

A first portion 734 of a metallization layer is located over the ferroelectric capacitor 720. A second portion 736 of the metallization layer is formed over and in electrical contact with the second rectangular contact 732. The second portion 736 is electrically isolated from the first portion 734.

As a result, a local interconnect is formed between the second portion 736 and the first active region 706. The local interconnect comprises a conductive path that employs the top and bottom electrodes 726, 722. The conductive path includes, the second rectangular contact, the top electrode 726 and the bottom electrode 722 in parallel, the first rectangular contact 730, and the first contact 716. The second contact 718 facilitates the electrical contact between the second rectangular contact 732 and the bottom electrode 722. By using a rectangular contact it is possible to make a reliable electrical connection between the bottom or top electrode of the capacitor with another contact also next to or partially under the capacitor. This will hold true even considering the experimental misalignment between the various layers that actually occurs in production.

As stated above, standard contacts are typically circular and are frequently drawn as a square. The inventors of the present invention recognize that non-standard shaped contacts can also be employed, such as rectangular (non-square) shaped contacts, pseudo-ellipses, and the like for example, to facilitate interconnection, mitigate resistance, and the like.

As a local interconnect between metal and substrate (poly or source drain for example), the capacitors top electrode is connected to one or more metal connections using contacts while the capacitors bottom electrode is connected to one or more substrate connections. To complete the electrical circuit it is necessary to connect the capacitors top and bottom electrode together. This can be done as shown in FIGS. 6 and 7 at one of connections to metal or substrate. It is also possible to do so with two rectangular contacts (one above and one below the capacitor) at the edge of a capacitor. The bottom side of the bottom contact might just touch a dielectric like field oxide while the top side of the top contact might also touch intermetal dielectric. The shape of the interconnect capacitor (shorted) is such that it connects desired top and bottom connections plus passes over regions with shared opening in the top metal and bottom contact.

The formed local interconnect employs the rectangular contacts and top and bottom electrodes in order to provide a relatively low resistance interconnect. It is appreciated that other shaped contacts, including standard and non-standard shaped contacts, can be used in place of the above rectangular shaped contacts that provide electrical contact to both the top and bottom electrodes.

The above figures have provided a number of examples of aspects of the present invention that employ ferroelectric capacitor electrodes as local interconnects. It is appreciated that the present invention is not listed to the above enumerated example, but extends to variations and combinations thereof. Aspects include employing top and/or bottom electrodes for local interconnects between features including, but not limited to, source/drain regions, polysilicon gates, metallization layers, wordlines, bitlines, and the like.

Figure 8:
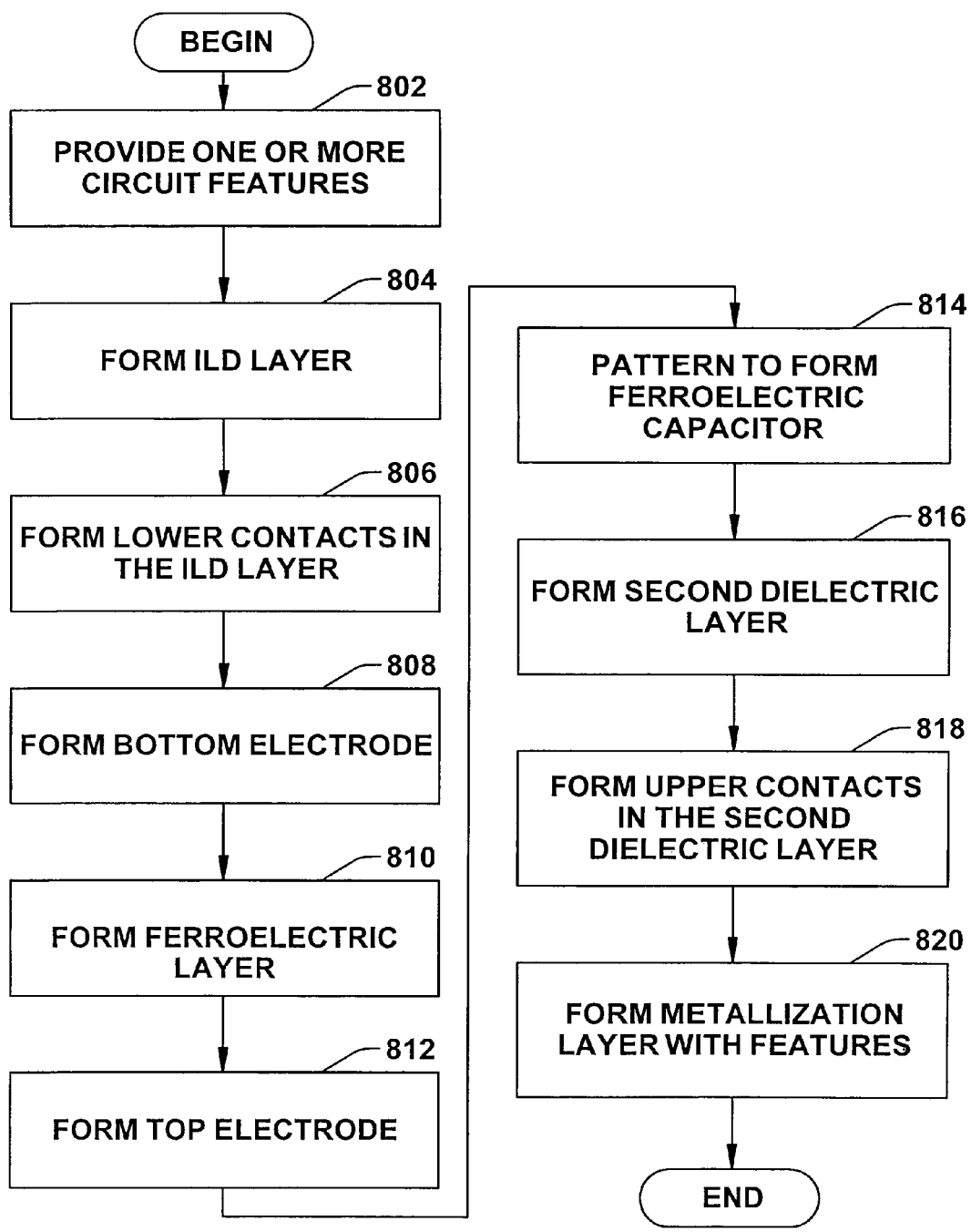
FIG. 8 is a flow diagram illustrating a method 800 of fabricating a semiconductor device employing ferroelectric capacitor electrodes as local interconnects in accordance with an aspect of the present invention.

FIG. 8 is a flow diagram illustrating a method 800 of fabricating a semiconductor device employing ferroelectric capacitor electrodes as local interconnects in accordance with an aspect of the present invention.

While the method 800 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

A semiconductor device comprising one or more circuit elements or features is provided at block 802. The features can include, for example, source/drain regions, gate structures, contact regions, and the like. The features can have silicide regions formed thereon in order to facilitate device operation.

An interlevel dielectric (ILD) layer is formed over the device at block 804. The interlevel dielectric layer can be formed by depositing a suitable dielectric to form a selected thickness.

One or more lower contacts are formed in the interlevel dielectric layer at block 806. One or more of which, in this example, can be connected to the one or more features. For example, one of the contacts can be formed so as to be in electrical contact with an active region. In another example, one of the contacts is formed so as to be in electrical contact with a polysilicon gate. In another example, one of the contacts is formed over an isolation region.

The contacts can be formed by a suitable process, such as a sputter, and comprise a conductive material, such as tungsten. A barrier layer can be formed in openings prior to depositing conductive material, for example to facilitate adhesion, mitigate diffusion, and the like. Additionally, a variety of shapes and sizes can be employed for the lower contacts. For example, rectangular shaped contacts can be formed.

A bottom electrode is formed over the interlevel dielectric layer and in electrical contact with one or more lower contacts. The bottom electrode is comprised of a conductive material, such as a noble metal, iridium, iridium oxide, and the like. As a result, the bottom electrode in conjunction with the lower contacts can form local interconnects between the features.

A ferroelectric layer is formed on the bottom electrode at block 810. The ferroelectric layer is comprised of a suitable ferroelectric material, such as PZT and the like.

A top electrode is formed on the ferroelectric layer at block 812. The top electrode is comprised of a conductive material, such as, for example, a noble metal such as Pt, Ru, Au, Pd or Ir and/or conductive oxide such as iridium, iridium oxide, Pt, Pd, PdOx, Au, Ru, RuOx, Rh, RhOx, LaSrCoO3, (Ba, Sr)RuO3, LaNiO3 or any stack or combination thereof.

Additionally, it is noted that the top and/or bottom electrodes can be formed with altered electrical resistivity in order to obtain desired electrical conductivity. The altered resistivity is relative to a similar device where the electrode(s) are not employed as interconnects. The altered resistivity can be selected according to interconnect parameters and/or performance typically, without substantially impacting ferroelectric capacitor performance. For example, in some instances, a lowered resistivity may be desired for interconnects and can be at least partially obtained by an altered resistivity of the top and/or bottom electrodes.

As an example, a change in resistivity can be made by modifying the thickness of the various layers, such as top and bottom electrodes, and in particular the highest conductivity layer. Another approach to achieve a higher conductivity would be to either replace and/or add a high conductivity material. For example, the hardmask and/or electrodes can be modified to include a high conductivity layer, such as a high conductivity layer comprised of aluminum (Al), silver (Ag), copper (Cu), gold (Au), alloys thereof and the like. Such a layer might be on top of or underneath a layer that acts as a conductive diffusion barrier such as TiN, TiAlN, TiSiN, TaN or TaSiN. The bottom electrode material can connect to ferroelectric and, in one example, is typically a noble metal or conductive oxide. This material is can be selected to achieve the desired ferroelectric property. The layer above is typically a noble metal if a conductive oxide is used in order to make reliable electrical connection from the top layer (diffusion barrier) to the conductive oxide. For example, if a conductive oxide is used such as SrRuO3, IrOx or RuOx then a higher conductivity material like Au, Ag or Pd might be used instead of Ir, Ru or Pt. It is also possible to choose materials/thicknesses for the top and/or bottom electrodes and proximate layers that reduce the conductivity. For example, a lower conductivity might be desired by one electrode if it is being optimized as a resistor. The other electrode might be optimized for high conductivity in order to be a better interconnect.

One method to achieve a lower conductivity with nearly the same properties is to alloy the film. For example if you are using Ir bottom electrodes you could increase its resistance by alloying with other noble metals such as Rh or even small amounts of non-reactive insulating materials such as TiOx, ZrOx or AlOx. These materials tend to reduce the grain size and segregate at the grain boundaries.

The top electrode, the ferroelectric layer, and the bottom electrode are patterned at block 814 in order to form a ferroelectric capacitor. A hardmask layer can be employed for patterning the top electrode, ferroelectric layer, and the bottom electrode.

A second dielectric layer is formed over the interlevel dielectric layer at block 816. The second dielectric layer is also comprised of a suitable dielectric material and can be comprised of multiple dielectric layers.

One or more upper contacts are formed in the second dielectric layer at block 816. At least a portion of the one or more upper contacts can be in electrical contact with the top electrode. Additionally, one or more of the upper contacts can be formed in electrical contact with one or more of the lower contacts. Additionally, a variety of shapes and sizes can be employed for the lower contacts. For example, rectangular shaped contacts can be formed that contacts both the top and bottom electrodes.

A metallization layer is formed over the second dielectric layer, wherein conductive portions or features of the metallization layer are in contact with one or more of upper contacts at block 820. Local interconnects can result between various features by way of the top and/or bottom electrodes. Examples of some of the interconnects that can be formed are described supra.

Figure 9:
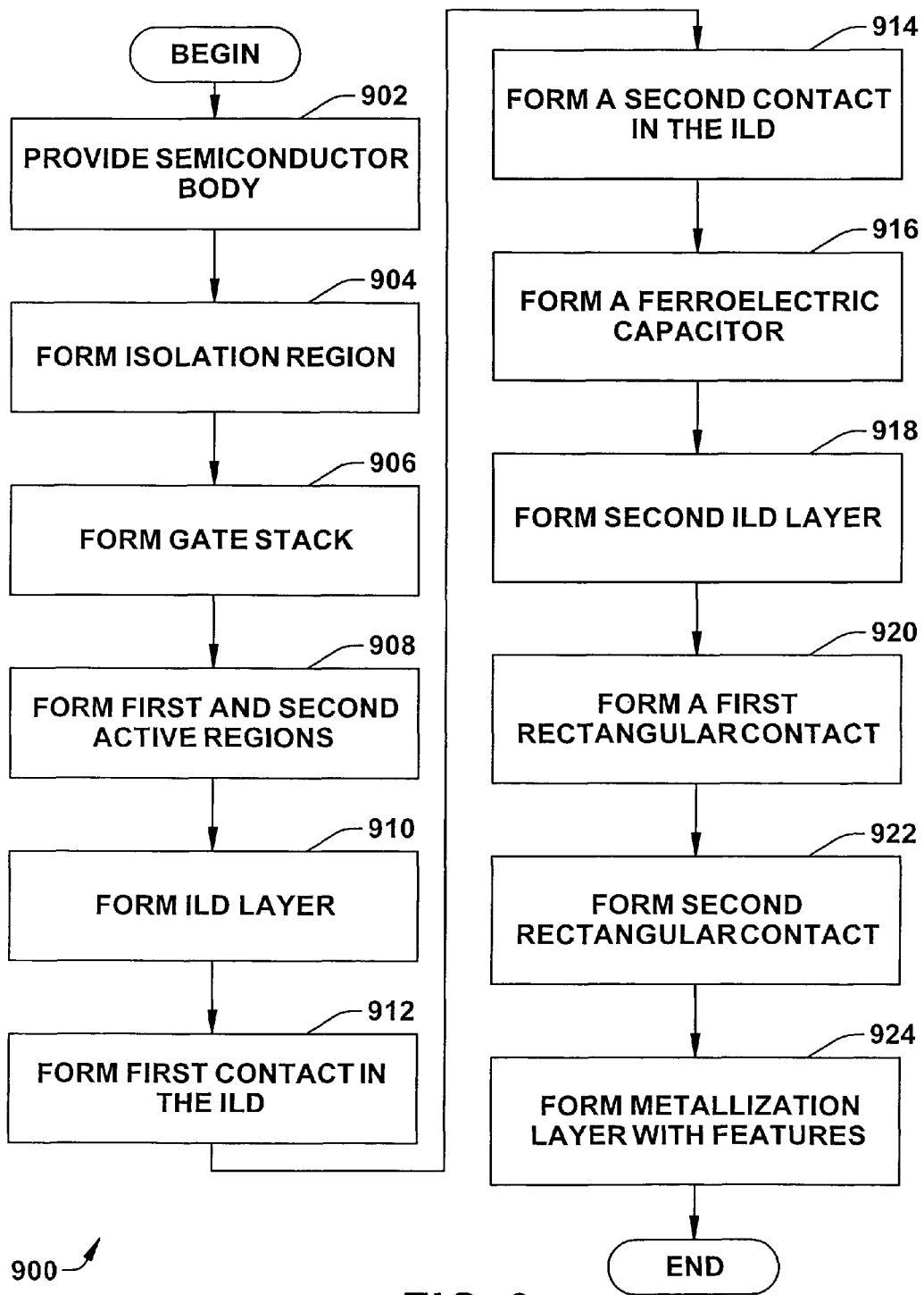
FIG. 9 is a flow diagram illustrating a method 900 of fabricating a semiconductor device employing ferroelectric capacitor electrodes for local interconnects in accordance with an aspect of the present invention.

FIG. 9 is a flow diagram illustrating a method 900 of fabricating a semiconductor device employing ferroelectric capacitor electrodes for local interconnects in accordance with an aspect of the present invention.

While the method 900 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The method begins at block 902, wherein a semiconductor body or substrate is provided. The semiconductor body can have one or more semiconductor layers formed therein. An isolation region is formed on/over a portion of the semiconductor body at block 904. A gate stack is then formed on the semiconductor body at block 906. In one example, the gate stack can be formed by depositing a suitable gate dielectric material to form a gate dielectric layer, forming a polysilicon gate layer on the gate dielectric layer, and patterning to define and form the gate stack. Silicide regions and/or sidewall(s) can also be formed on or adjacent to the gate stack.

First and second active regions or source/drain regions are formed in the semiconductor body at block 908. Other processes such as formation of well regions, lightly doped drain regions, threshold voltage implants, and the like can also be performed. A first interlevel dielectric (ILD) layer is then formed over the semiconductor body at block 910. The first interlevel dielectric layer is comprised of a suitable dielectric material.

A first contact is formed in the first interlevel dielectric layer over and in electrical contact with the first active region at block 912. The contact can be formed by selectively etching a hole in the first interlevel dielectric layer and filling the hole with conductive material, such as tungsten. A second contact is formed in the first interlevel dielectric layer over the isolation region at block 914.

A ferroelectric capacitor is formed over the first interlevel dielectric layer at block 916. The ferroelectric capacitor is formed so as to have a portion overlying the first contact and another portion overlying the second contact, such as shown in FIG. 7. A bottom electrode is formed on the first interlevel dielectric layer or on a barrier diffusion layer located on the first interlevel dielectric layer. In one example, the bottom electrode is comprised of a noble metal comprising material, such as Iridium or Iridium oxide. A ferroelectric layer, such as a layer comprised of PZT, having ferroelectric properties is formed on the bottom electrode. A top electrode is formed on the ferroelectric layer and is comprised of a conductive material, such as iridium, iridium oxide, and the like. The stack, comprised of the top electrode, the ferroelectric layer, and the bottom electrode, is then patterned to form and define the ferroelectric capacitor. Other barrier layers and the like can also be formed surrounding the ferroelectric capacitor.

A second interlevel dielectric layer is formed over the first dielectric layer and the ferroelectric capacitor at block 918. The second interlevel dielectric layer is comprised of a dielectric material. A first rectangular contact is formed in the second interlevel dielectric layer over the first contact and an edge portion of the ferroelectric capacitor at block 920. The rectangular contact can be formed by selectively etching a rectangular shaped opening in the second interlevel dielectric layer and filling the opening with conductive material, such as tungsten. In one example, the rectangular contact has a length twice its width. A second rectangular contact is formed in the second interlevel dielectric layer over the second contact and another edge portion of the ferroelectric capacitor at block 922.

A metallization layer is then formed over the second interlevel dielectric layer at block 924. The metallization layer comprises conductive or metal lines and includes a portion formed over the second rectangular contact. As a result, a conductive path is provided from the first active region to the portion of the metallization layer, such as shown in FIG. 7.

It is noted that the previous figures can be referenced for examples and additional details of devices formed by variations of the method 900.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A device comprising:
   one or more circuit features formed within or on a semiconductor body;
   a first dielectric layer formed over the semiconductor body;
   lower contacts formed within the first dielectric layer;
   a bottom electrode structure formed over the first dielectric layer and on a first portion of the lower contacts, thereby defining a first local interconnect;
   a ferroelectric layer formed on the bottom electrode structure;
   a top electrode structure formed on the ferroelectric layer;
   a second dielectric layer formed over the top electrode structure; and
   upper contacts formed within the second dielectric layer, a first portion of the upper contacts formed on the top electrode structure, thereby defining a second local interconnect; wherein physically adjacent portions of the bottom electrode structure, the top electrode structure, and a first contact of the first portion of upper contacts are electrically connected.

2. The device of claim 1, further comprising a metallization layer formed on the second dielectric layer having one or more conductive features in contact with the first portion of the upper contacts.

3. The device of claim 1, wherein the first portion of the lower contacts are formed on the one or more circuit features.

4. The device of claim 1, wherein the first of the first portion of upper contacts is formed on a first of the second portion of lower contacts.

5. The device of claim 1, wherein one of the first portion of lower contacts and one of the first portion of upper contacts are rectangular shaped contacts.

6. The device of claim 1, wherein one of the first portion of lower contacts is in contact with the top electrode structure and the bottom electrode structure.

7. The device of claim 1, further comprising a second bottom electrode structure formed over the first dielectric layer and on a second portion of the lower contacts.

8. The device of claim 7, further comprising a second ferroelectric layer formed on the second bottom electrode structure and a second top electrode structure formed on the second ferroelectric layer, wherein a second portion of the upper contacts are in contact with the second top electrode structure.

9. The device of claim 1, wherein the bottom electrode structure and the top electrode structure comprise multiple conductive layers including a high conductivity layer comprised at least partially of a high conductivity material selected from the group consisting of Al, Ag, Cu, Au, and/or alloys thereof.

10. The device of claim 1, wherein the one or more circuit features include polysilicon gates.

11. A method of fabricating a device comprising:
   providing a semiconductor body comprising one or more circuit features;
   forming a first dielectric layer over the semiconductor body;
   forming lower contacts in the first dielectric layer;
   forming a bottom electrode structure over the first dielectric layer and on a first portion of the lower contacts to form a first local interconnect;
   forming a ferroelectric layer on the bottom electrode structure;
   forming a top electrode structure on the ferroelectric layer;
   forming a second dielectric layer over the first dielectric layer and the top electrode structure; and
   forming upper contacts in the second dielectric layer, a first portion of the upper contacts formed on the top electrode structure to form a second local interconnect, wherein physically adjacent portions of the bottom electrode structure, the top electrode structure, and a first contact of the first portion of upper contacts are electrically connected.

12. The method of claim 11, further comprising forming conductive features over the second dielectric layer and in contact with the first portion of the upper contacts.

13. The method of claim 11, wherein providing the semiconductor body comprising the circuit features comprises forming active regions and a gate structure.

14. The method of claim 11, wherein forming the top electrode structure comprises selecting a resistivity of the top electrode structure and forming the top electrode structure with a thickness according to the selected resistivity.

15. The method of claim 11, wherein forming the bottom electrode structure comprises depositing a conductive material with an amount of non-reactive insulating materials to yield a higher resistance for the bottom electrode structure.

16. The method of claim 11, wherein forming the bottom electrode structure comprises forming multiple layers including a high conductivity layer comprised at least partially of a high conductivity material selected from the group consisting of Al, Ag, Cu, Au, and/or alloys thereof.

17. The method of claim 11, wherein forming the top electrode structure comprises forming multiple layers including a high conductivity layer comprised at least partially of a high conductivity material selected from the group consisting of Al, Ag, Cu, Au, and/or alloys thereof.

18. The method of claim 11, wherein the first contact of the first portion of upper contacts has a rectangular shape.

19. The method of claim 11, wherein one of the first portion of upper contacts and one the first portion of lower contacts are rectangular shaped contacts.

* * * * *